United States Patent
Yang (10) Patent No.: US 10,020,281 B2
(45) Date of Patent: Jul. 10, 2018

(54) METAL BONDING PADS FOR PACKAGING APPLICATIONS

(71) Applicant: International Business Machines Corporation, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/251,520

(22) Filed: Aug. 30, 2016

(65) Prior Publication Data

US 2018/0061804 A1 Mar. 1, 2018

(51) Int. Cl.
- H01L 21/00 (2006.01)
- H01L 23/00 (2006.01)
- H01L 25/065 (2006.01)
- H01L 25/00 (2006.01)

(52) U.S. Cl.
CPC .............. *H01L 24/80* (2013.01); *H01L 24/05* (2013.01); *H01L 25/0657* (2013.01); *H01L 25/50* (2013.01); *H01L 2224/02205* (2013.01); *H01L 2224/02215* (2013.01); *H01L 2224/05011* (2013.01); *H01L 2224/05124* (2013.01); *H01L 2224/05147* (2013.01); *H01L 2224/05184* (2013.01); *H01L 2224/80004* (2013.01); *H01L 2224/80203* (2013.01); *H01L 2224/80895* (2013.01); *H01L 2225/06524* (2013.01); *H01L 2924/01013* (2013.01); *H01L 2924/01022* (2013.01); *H01L 2924/01027* (2013.01); *H01L 2924/01044* (2013.01); *H01L 2924/01045* (2013.01); *H01L 2924/01073* (2013.01); *H01L 2924/01074* (2013.01); *H01L 2924/01077* (2013.01); *H01L 2924/0529* (2013.01)

(58) Field of Classification Search
CPC ......... H01L 21/00; H01L 24/80; H01L 24/05; H01L 25/0657; H01L 2224/05011
See application file for complete search history.

(56) References Cited

U.S. PATENT DOCUMENTS

| | | | |
|---|---|---|---|
| 6,291,343 B1 | 9/2001 | Tseng et al. | |
| 8,420,537 B2 | 4/2013 | Chanda et al. | |
| 2009/0297759 A1* | 12/2009 | Chanda | H01L 21/76877 428/83 |
| 2010/0171224 A1* | 7/2010 | Leedy | H01L 21/76898 257/773 |
| 2010/0255262 A1* | 10/2010 | Chen | B23K 20/023 428/172 |

(Continued)

FOREIGN PATENT DOCUMENTS

WO 2001061743 A1 8/2001

*Primary Examiner* — Joseph C Nicely
*Assistant Examiner* — Wilner Jean Baptiste
(74) *Attorney, Agent, or Firm* — Cantor Colburn LLP; Louis Percello (57) ABSTRACT

Methods and semiconductor devices for bonding a first semiconductor device to a second semiconductor device include forming metal pads including a textured microstructure having a columnar grain structure at substantially the same angular direction from the top surface to the bottom surface. The textured crystalline microstructures enables the use of low temperatures and low pressures to effect bonding of the metal pads. Also described are methods of packaging and semiconductor devices.

12 Claims, 6 Drawing Sheets

(56) References Cited

U.S. PATENT DOCUMENTS

| | | | |
|---|---|---|---|
| 2011/0272802 A1* | 11/2011 | Ogashiwa | H01L 24/11 |
| | | | 257/737 |
| 2012/0241961 A1* | 9/2012 | Kagawa | H01L 24/80 |
| | | | 257/758 |
| 2012/0251714 A1* | 10/2012 | Miller | B22F 1/0014 |
| | | | 427/140 |
| 2014/0117546 A1* | 5/2014 | Liu | H01L 24/80 |
| | | | 257/751 |

* cited by examiner

METAL BONDING PADS FOR PACKAGING APPLICATIONS

The present relates generally to the field of semiconductor devices, and more particularly, to the interconnection and packaging of an integrated circuits having metal bonding pads.

Integrated circuits (ICs) typically have one or more semiconductor-based circuits wired by metal interconnects, which in turn, have terminal inputs and outputs (I/O) to external circuitry. These ICs are often mounted on a mounting area of a lead frame having leads. Each I/O terminal is then connected to a lead by a thin bonding wire, which is typically made of gold or aluminum.

In making interconnections within an IC, each region of the semiconductor is provided with an electrode for connection with the bonding wire for connecting regions of the IC to each other. For those connections having an external lead, a bonding pad or electrode is typically prepared for making the desired interconnection. This is often accomplished by connecting a bonding wire to the electrode or bond pad by means of thermocompression or thermosonic bonding to form a small, rigid ball at the end of the bonding wire. This small ball is then pressed onto the electrode under high temperature while ultrasonically exciting the wire.

SUMMARY

Described herein are methods for bonding a first semiconductor device to a second semiconductor device, methods of forming a copper-to-copper bond in packaging of semiconductor devices; and semiconductor devices.

In one or more embodiments, a method for bonding a first semiconductor device to a second semiconductor device includes providing a first semiconductor device including a first metal pad, wherein the first metal pad has a textured microstructure having a columnar grain structure at substantially the same angular direction from the top surface to the bottom surface. A second semiconductor device including a second metal pad is then provided, wherein the second metal pad has a textured microstructure having a columnar grain structure at substantially the same angular direction from the top surface to the bottom surface. The second metal pad is then contacted with the first metal pad followed by bonding the first semiconductor device to the second semiconductor device at a temperature of less than 250° C. to greater than 100° C. and at a pressure of less than 250 psi to greater than 50 psi.

In one or more embodiments, a method of forming a metal-to-metal bond in packaging of semiconductor devices includes filling an opening provided in a sacrificial mandrel layer formed on a first semiconductor device with a metal. A sacrificial stress control layer is then formed directly on the metal. The metal is annealed to form a textured crystalline microstructure having a columnar grain structure at substantially the same angular direction from a top surface to a bottom surface of the metal. Once the textured crystalline microstructure is provided, the sacrificial stress control layer and a portion of the metal is removed so as to planarize the annealed metal in the opening and form a first metal pad. The first metal pad in the first semiconductor device is then bonded to a second metal pad formed in a second semiconductor device at a temperature of less than 250° C. to greater than 100° C. and at a pressure of less than 250 psi to greater than 50 psi, wherein the second metal pad in the second semiconductor device has a textured crystalline microstructure having a columnar grain structure at substantially the same angular direction from a top surface to a bottom surface.

In one or more embodiments, a semiconductor device includes at least one metal-to-metal bond between a first semiconductor device and a second semiconductor device, the first semiconductor device comprising a first metal pad, wherein the first metal pad has a textured microstructure having a columnar grain structure at substantially the same angular direction from the top surface to the bottom surface; and a second semiconductor device including a second metal pad having a textured microstructure having a columnar grain structure at substantially the same angular direction from the top surface to the bottom surface, wherein the at least one metal-to-metal bond consists of the first and second metal pads.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

The dimensions of integrated circuit elements have been steadily shrinking as scaling to smaller dimensions leads to continuing device performance improvements. Consequently, the dimensions of copper lines and solder joints shrink dramatically resulting in several challenges. As a result, it can be desirable for solders to be removed from joints in the future and replaced with copper joints for fine pitch packaging. However, the high bonding temperatures in excess of 400° C. and pressures in excess of 350 pounds per square inch (psi) result in damage to the various devices. For example, bonding at high temperatures and high pressures can induce cracks/damage in the dielectric layers of the integrated circuit when stresses are applied, which can ultimately lead to semiconductor failure.

The present invention is generally directed to a low temperature and low pressure metal-to-metal bonding process for packaging applications and structures thereof. As will be discussed in greater detail, metal bonding pads such as copper can be formed with a modulated microstructure that produces a textured microstructure that is non-random as opposed to a random microstructure. Using copper as an example, the textured microstructure has unexpectedly been found to provide greater diffusivity of atoms on the order of 3 to 4 times compared to a random microstructure, which advantageously permits metal-to-metal bonding of the textured microstructures at relatively low temperatures and low pressures with high bond strength suitable for use in packaging applications.

Figure 1:
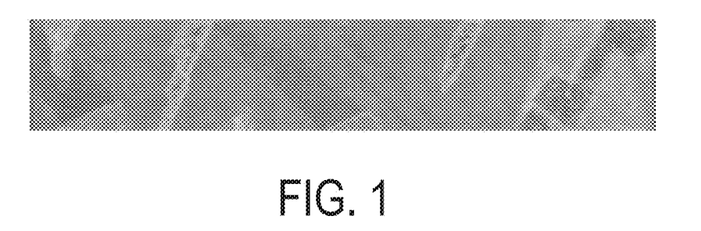
FIG. 1 is a micrograph illustrating a random microstructure for a copper metal conventionally fabricated.
Figure 2:
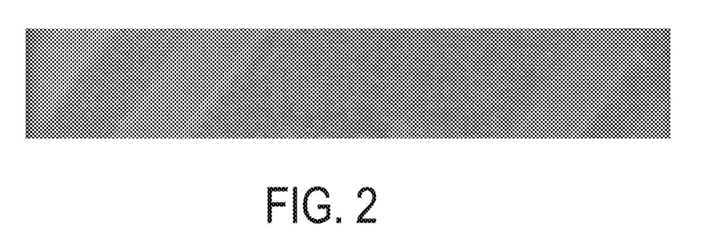
FIG. 2 is a micrograph illustrating a textured microstructure for a copper metal fabricated in accordance with one or more embodiments of the present invention.

Turning now to FIGS. 1 and 2, there are micrographs illustrating cross sections of a copper metal fabricated in a conventional manner and a copper metal fabricated in accordance with one or more embodiments of the present invention, respectively, which will be described in further detail below. As shown in FIG. 1, copper deposited in a conventional manner such as by electroplating, sputtering, plasma vapor deposition, evaporation, solder waver, IMS injection molded solder, or the like followed by annealing produces a random polycrystalline microstructure with contrasting grain structure, i.e., irregular grain structure with planes in multiple angular directions. In contrast, the microstructure of the copper metal fabricated in accordance with one or more embodiments of the present invention, which will be discussed in greater detail below, produces a textured microstructure as shown in FIG. 2, wherein the crystalline microstructure in comparison is highly ordered, i.e., the visible columnar planes extend in substantially the same angular direction from the top surface to the bottom surface of the copper metal layer to provide ordered columnar grain growth of the copper. As noted above, the highly ordered textured microstructure unexpectedly allows for significantly lower temperatures and pressures for bonding applications to other textured microstructures due to the greater diffusivity observed resulting from the textured microstructures.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the disclosed structures, as they are oriented in the drawing figures. The same numbers in the various figures can refer to the same structural component or part thereof.

Figure 3:
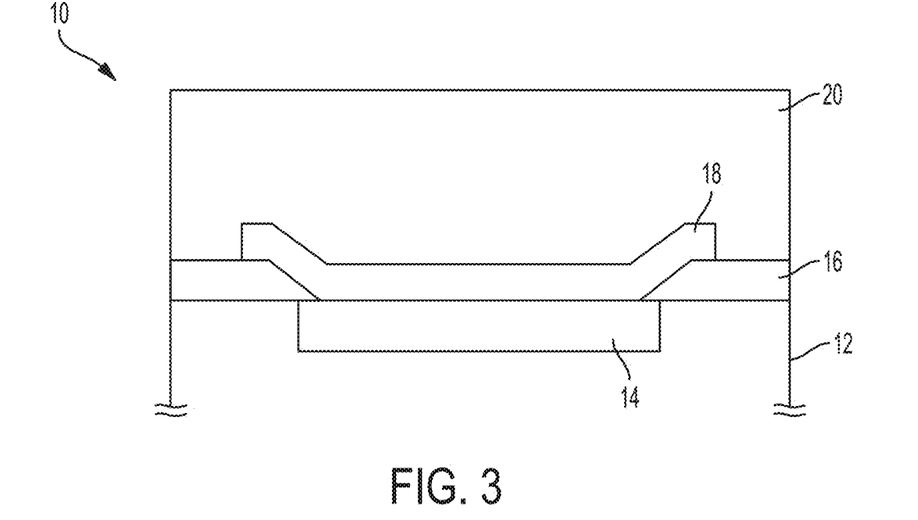
FIG. 3 depicts a cross sectional view of a portion of a semiconductor device including a substrate, a last level metal, an insulator, a conductive adhesion layer, and a lithographically defined sacrificial mandrel overlying the conductive adhesion layer in accordance with one or more embodiments.

Turning now to the drawings, FIG. 3 depicts a cross sectional view of a portion of semiconductor device 10 including a substrate 12, a last level metal 14, an insulator 16, a conductive adhesion layer 18, and a lithographically defined sacrificial mandrel 20 overlying the conductive adhesion layer 18.

The sacrificial mandrel 20 can be a polymer passivation layer such as a polyimide, kapton, spin-on material or other sacrificial material known to those skilled in the art. The adhesion layer 18 is formed of a conductive material such as titanium and/or chromium-copper alloy.

Figure 4:
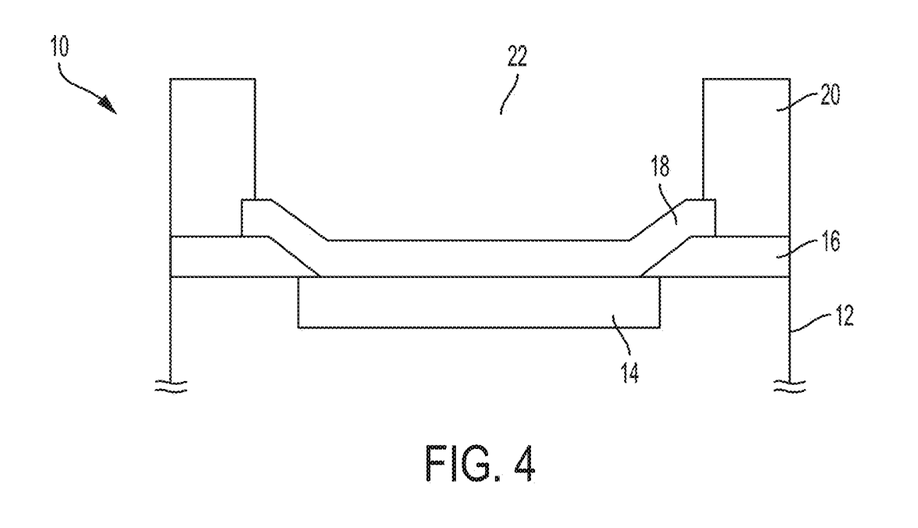
FIG. 4. depicts a cross sectional view of the portion of the semiconductor device of FIG. 3 subsequent to forming an opening in the sacrificial mandrel.

In FIG. 4, the mandrel 20 is patterned to form an opening 22 exposing the adhesion layer 18. The mandrel can be patterned using lithography. Lithography can include forming a photoresist (not shown) onto at least the surfaces defining the mandrel 20, exposing the photoresist to a desired pattern of radiation, and then developing the exposed photoresist with a resist developer to provide a patterned photoresist. At least one etch can be employed to transfer the pattern from the patterned photoresist into the mandrel and form the opening 22. The etching process may be a dry etch (e.g., reactive ion etching, plasma etching, ion beam etching, or laser ablation). The etching process may be a wet chemical etch (e.g., potassium hydroxide (KOH)). Both dry etching and wet chemical etching processes may be used. After transferring the pattern, the patterned photoresist is removed utilizing resist stripping processes, for example, ashing.

Figure 5:
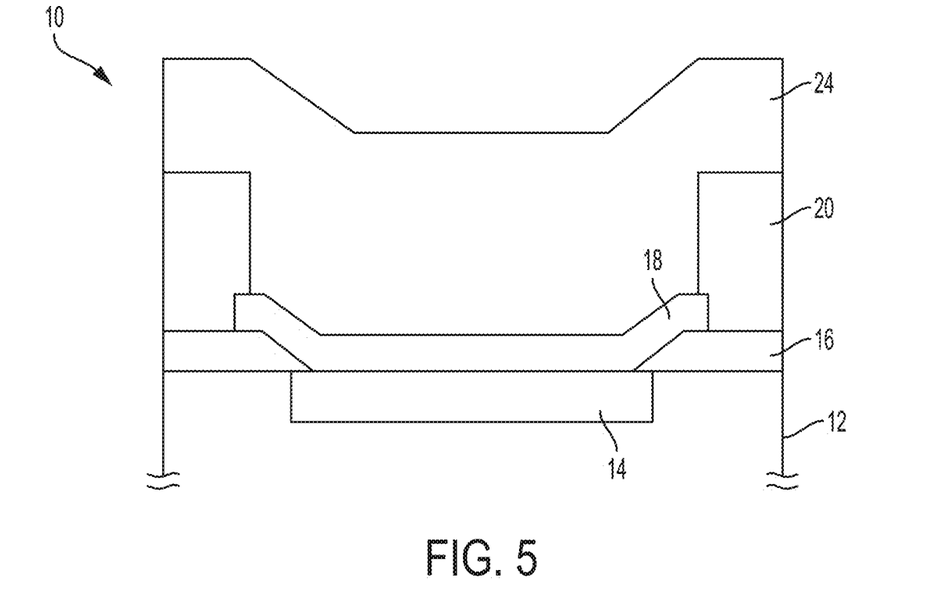
FIG. 5 depicts a cross sectional view of a portion of the semiconductor device of FIG. 4 subsequent to conformally depositing copper.

In FIG. 5, a metal layer 24 such as copper, aluminum, tungsten, alloys thereof, or the like is deposited into the opening 22 and the surfaces defined by the mandrel 20 as shown. The metal layer 24 can be deposited by sputtering, evaporation, physical vapor deposition, solder waver, IMS injection molded solder, electroless plating, electroplating, or the like. As deposited, the pre-anneal metal generally has a relatively small grain structure that is random throughout the layer.

In one or more embodiments, an optional seed layer (not shown) can first be deposited onto the patterned mandrel including the top planar surfaces, the opening sidewalls, and the opening bottom surface. It should be apparent that depending on the type of opening in the dielectric layer, e.g., trench, via, and the like, the bottom surface can be defined by the conductive adhesion layer 18 or the last metal layer 14 itself.

The function of the seed layer is to provide a base onto which the metal 24 can be deposited. The seed layer can be deposited by atomic layer deposition (ALD), sputter deposition, plasma vapor deposition (PVD), chemical vapor deposition (CVD) or the like.

Suitable seed layers are generally chosen to provide improved electromigration resistance, improved adhesion to the underlying liner layer, and improved surface properties suitable for deposition of the main conductor body. Exemplary copper alloys that have been shown to improve the electromigration resistance relative to pure copper, include Cu (Sn), Cu (In), Cu (zr), Cu (Ti) and Cu (C, N, O, Cl, S). Exemplary seed layers that improve the adhesion properties relative to pure copper which include Cu (Al), Cu (Mg), and alloys of Cu with other reactive metals such as Be, Ca, Sr, Ba, Sc, Y, La, and rare earth series elements of Ce, Pr, Nd, Sm, Eu, Gd, Tb, Dy, Ho, Er, Tm, Yb and Lu, and Hf, V, Mb, Ta, Cr, Mo, W, Mn, Re, Si and Ge. The seed layer can include additional alloying elements that improve surface properties for the seed layer such as B, O, N, P, Fe, Ru, Os, Co, Rh, Ir, Ni, Pd, Pt, Ag, Au, Zn and Cd. Uniformity of seed layer is typically desired, since a poor seed layer can result in voids. It is also desirable to ensure that the seed layer surface is free of oxides for efficient charge transfer during plating.

Figure 6:
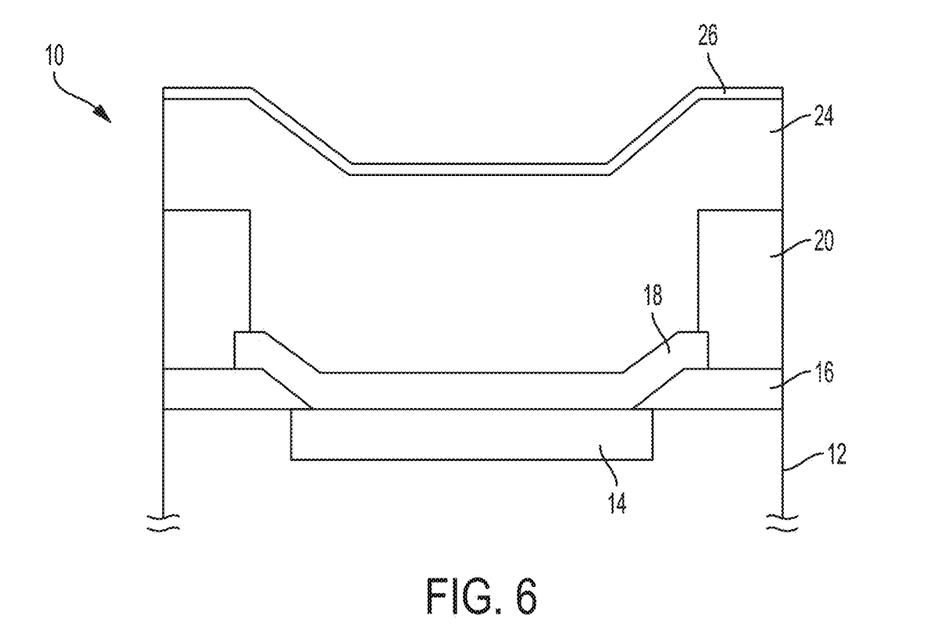
FIG. 6 depicts a cross sectional view of a portion of the semiconductor device of FIG. 5 subsequent to depositing a sacrificial stress locking layer onto the copper.

In FIG. 6, a sacrificial stress control layer 26 is deposited onto the metal layer 24. The sacrificial stress control layer 26 is deposited prior to annealing of the metal layer. The stress control layer 26 can be deposited onto the metal layer at a thickness of 1 nanometer (nm) to 100 nm. In one or more other embodiments, the thickness of the stress control layer is 1 nm to 50 nm. The sacrificial stress control layer may be deposited by chemical-vapor deposition (CVD), physical vapor deposition (PVD), atomic layer deposition (ALD), plating, sputtering or any other desired deposition technique, as is well understood by those skilled in the art.

Suitable materials for the sacrificial stress control layer 26 include tantalum, titanium, aluminum, tungsten, cobalt, ruthenium, iridium, rhodium, nitrides thereof, cobalt tungsten phosphide, and combinations thereof. For adhesion enhancement to Cu, an alloy or mixture comprising titanium added to tantalum, chromium, molybdenum, tungsten, rhodium, or rhenium can be used.

Figure 7:
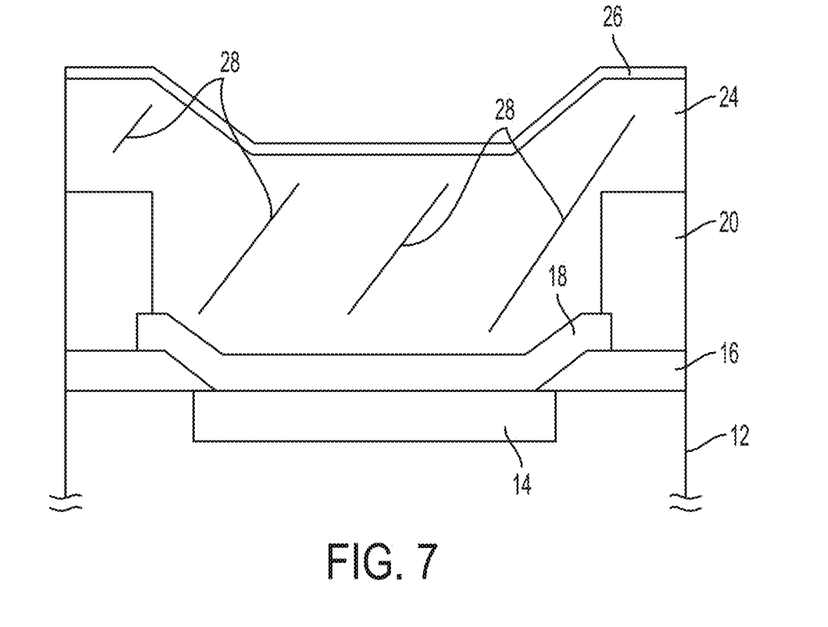
FIG. 7 depicts a cross sectional view of a portion of the semiconductor device of FIG. 6 subsequent to annealing the copper to form a textured microstructure.

In FIG. 7, following deposition of the sacrificial stress control layer 26, the semiconductor device 10 is subjected to an annealing process. As is understood, annealing causes copper recrystallization and grain growth to produce relatively larger grains structures than that originally deposited. Exemplary annealing processes include furnace anneal, laser anneal or the like. The furnace anneal generally includes heating the semiconductor device 10 at a temperature within a range from 100° C. to 500° C. for a period of time typically from 20 minutes to 4 hours, although longer and shorter times can be used. Laser annealing can generally be at a temperature within a range from of 400° C. to 900° C. and period time of 10 nanoseconds to 5 minutes. although longer and shorter times can be used.

The presence of the stress control layer 26 provides the textured microstructure to the metal layer 24, wherein the grains of metal layer 24 are columnar and generally extend from the top surface to the bottom surface at the same angular direction as indicated by liners 28. That is, the recrystallization and grain growth during the anneal result in columnar microstructure boundaries that are oriented substantially perpendicular to the plane of the layers of metal. The textured copper microstructure has a columnar grain structure as is generally shown in FIG. 2.

Figure 8:
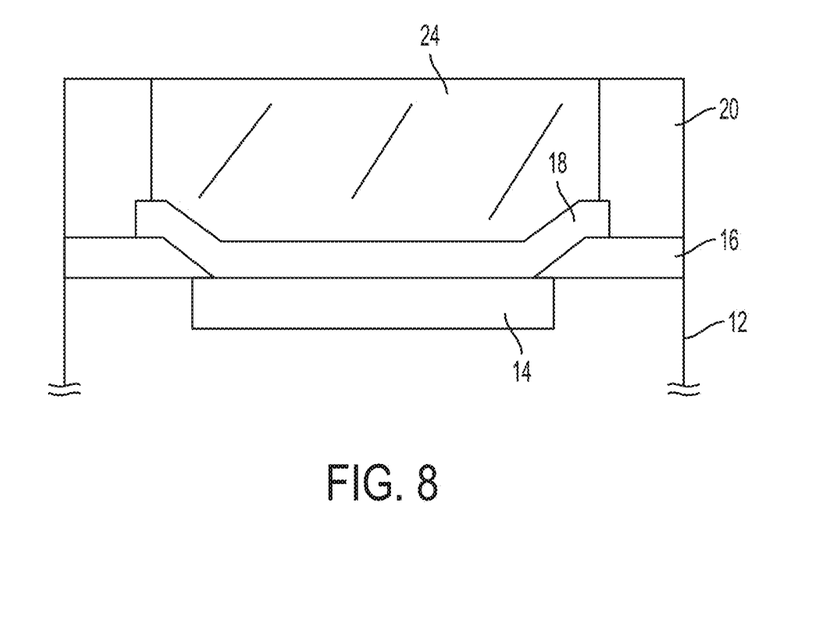
FIG. 8 depicts a cross sectional view of a portion of the semiconductor device of FIG. 7 subsequent to a planarization process.

In FIG. 8, the stress control layer 26 is removed and the metal layer 24 is subjected to a planarization step. By way of example, the substrate can be subjected to a chemical mechanical planarization (CMP) process, leaving the metal 24 with columnar or bamboo-type grains having boundaries 28 across the full thickness. The CMP process planarizes the surface of the metal layer 24 to the mandrel 20 by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry.

Figure 9:
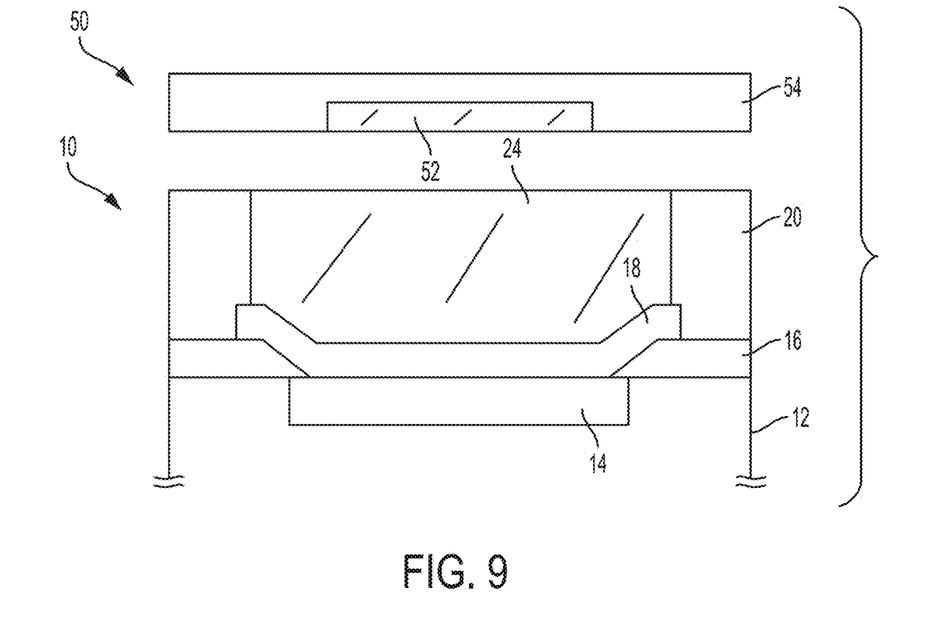
FIG. 9 depicts a cross sectional view of a portion of the semiconductor device of FIG. 8 and an additional semiconductor device including a copper pad having a textured microstructure aligned therewith for low temperature and low pressure copper-to-copper bonding of the semiconductor device to the additional semiconductor device.

In FIG. 9, the semiconductor device 10 is bonded to a second semiconductor device 50 including a metal pad (such as Cu, Al, or their alloys) 52, e.g., an I/O pad formed in an insulator layer 54. The metal pad 52 has a textured microstructure fabricated in a similar manner to that above, i.e., deposition of a stress locking layer prior to annealing and subsequent removal by chemical mechanical planarization, for example. Because both metal pads 24, 52 are textured, the bonding temperature as well as bonding pressure can be lowered.

In one or more embodiments, the metal pads in the respective devices 10, 50 can be bonded to each other at a temperatures less than 250° C. to greater than 100° C. at pressures (i.e., a compressive stress) of less than 250 pounds per square inch (psi) to greater than 50 psi. In one or more other embodiments, bonding can be effected at temperatures less than 200° C. to greater than 100° C. at pressures of less than 200 psi to 100 psi. In still one or more other embodiments, bonding can be effected at temperatures less than 175° C. to greater than 125° C. at pressures of less than 150 psi to 75 psi.

By way of example, the respective metal pads can be bonded at a temperature of 150° C. at a compressive stress of about 110 psi for 60 minutes at $10^{-3}$ torr. In other examples, the metal pads can be bonded at a temperature of 200° C. for a period of 30 minutes at the same pressure.

Figure 10:
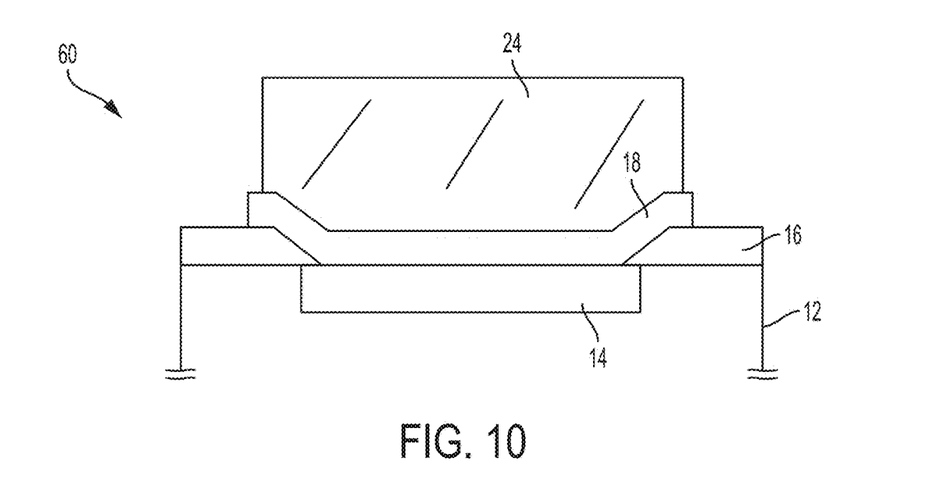
FIG. 10 depicts a cross sectional view of a portion of the semiconductor device of FIG. 8 subsequent to removal of a remaining portion of the sacrificial mandrel.
Figure 11:
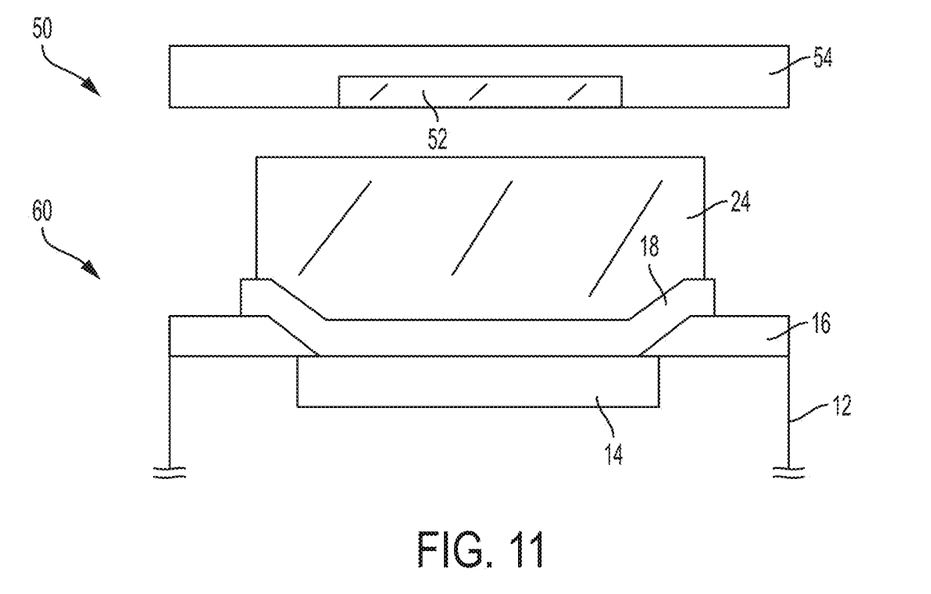
FIG. 11 depicts a cross sectional view of a portion of the semiconductor device of FIG. 10 and an additional semiconductor device including a copper pad having a textured microstructure aligned therewith for low temperature and low pressure copper-to-copper bonding of the semiconductor device to the additional semiconductor device.

In one or more other embodiments as shown in FIG. 10, the mandrel (see mandrel 20 in FIG. 4) is completely removed after metal deposition and processing. That is, openings are formed in the mandrel, and subsequently filled with copper metal and processed as described in relation to FIGS. 4-8. 10 depicts a cross sectional view of a portion of semiconductor device 60 resulting after removal of the mandrel portion. As illustrated, the resulting semiconductor device 60 includes the substrate 12, the last level metal 14, the insulator 16, the adhesion layer 18, and the copper metal pad 24, which is free of the sacrificial mandrel.

In this manner, the semiconductor device 50 with the I/O metal pad, for example, (or other active device) can be joined to the metal pad of another semiconductor device at the lower temperatures and lower pressures previously described.

By providing metal-to-metal bonding at the lower temperature and lower pressures, not only is an effective bond created without damage to any of the structures and/or devices contained therein, but the use of solder bumps can be eliminated. Elimination of solder bumps is advantageous because solder bumping tolerances do not have to be accommodated. As such, the openings to define the metal pads can be made with smaller lateral dimensions, and can be positioned closer together to match high precision semiconductor fabrication technology. Other disadvantages of solder bumping are also eliminated, such as different bumps having different heights or bumps being lost due to solder collapse.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a metal-to-metal bond in packaging of semiconductor devices, comprising:
    filling an opening provided in a sacrificial mandrel layer formed on a first semiconductor device with a metal;
    forming a sacrificial stress control layer directly on the metal;
    annealing the metal to form a textured crystalline microstructure having a columnar grain structure at substantially the same angular direction from a top surface to a bottom surface of the metal;
    removing the sacrificial stress control layer and a portion of the metal so as to planarize the annealed metal in the opening and form a first metal pad; and
    bonding the first metal pad in the first semiconductor device to a second metal pad formed in a second semiconductor device at a temperature of less than 250° C. to greater than 100° C. and at a pressure of less than 250 psi to greater than 50 psi, wherein the second metal pad in the second semiconductor device has a textured crystalline microstructure having a columnar grain structure at substantially the same angular direction from a top surface to a bottom surface and is formed by the method used for forming the first metal pad.

2. The method of claim 1, wherein the first and second metal pad comprise copper, aluminum, tungsten, nitrides thereof, or combinations comprising at less one of the foregoing.

3. The method of claim 1, wherein the stress control layer comprises tantalum, titanium, aluminum, tungsten, cobalt, ruthenium, iridium, rhodium, nitrides thereof, cobalt tungsten phosphide, or combinations comprising at less one of the foregoing.

4. The method of claim 1, wherein annealing the metal is at a temperature of 100° C. to 500° C. for a period of time of 20 minutes to 4 hours.

5. The method of claim 1, wherein removing the sacrificial stress control layer and the portion of the metal comprises chemical mechanical polishing planarization.

6. The method of claim 1, wherein bonding the first semiconductor device to the second semiconductor device at a temperature of less than 200° C. to greater than 100° C. and at a pressure of less than 200 psi to greater than 100 psi.

7. The method of claim 1, wherein bonding the first semiconductor device to the second semiconductor device at a temperature of less than 175° C. to greater than 125° C. and at a pressure of less than 150 psi to greater than 75 psi.

8. The method of claim 1, wherein the first semiconductor device comprises a last metal level, a conductive adhesion layer on the last metal level, and the first metal pad on the conductive adhesion layer; and the second metal pad on the second semiconductor device is an I/O terminal.

9. The method of claim 1, further comprising removing the sacrificial mandrel in its entirety subsequent to the annealing and prior to the bonding.

10. The method of claim 1, wherein the second metal pad having the textured crystalline microstructure is formed by depositing a sacrificial stress locking layer onto a metal for defining the second metal pad prior to annealing; annealing the metal to form the textured crystalline microstructure; and removing the sacrificial stress locking layer prior to bonding to form the second metal pad.

11. The method of claim 10, wherein annealing the metal to form the textured crystalline microstructure in the first and second semiconductor devices comprises furnace annealing at a temperature within a range from 100° C. to 500° C. for a period of time of 20 minutes to 4 hours.

12. The method of claim 10, wherein annealing the metal to form the textured crystalline microstructure in the first and second semiconductor devices comprises laser annealing at a temperature within a range from of 400° C. to 900° C. and a period time of 10 nanoseconds to 5 minutes.

* * * * *